United States Patent [19]
Honda

[11] Patent Number: 5,300,628
[45] Date of Patent: Apr. 5, 1994

[54] SELECTED CHELATE RESINS AND THEIR USE TO REMOVE MULTIVALENT METAL IMPURITIES FROM RESIST COMPONENTS

[75] Inventor: Kenji Honda, Barrington, R.I.

[73] Assignee: OCG Microelectronic Materials, Inc., West Paterson, N.J.

[21] Appl. No.: 906,183

[22] Filed: Jun. 29, 1992

[51] Int. Cl.$^5$ .................. C08F 12/36; C08F 6/08
[52] U.S. Cl. ..................... 528/482; 528/480; 528/481; 528/486; 528/492; 528/502; 210/638; 210/660; 525/332.2
[58] Field of Search .............. 528/480, 481, 482, 492, 528/502, 486; 210/638, 660; 525/332.2

[56] References Cited

U.S. PATENT DOCUMENTS

| | | | |
|---|---|---|---|
| 4,446,283 | 5/1984 | Parker | 525/383 |
| 4,965,167 | 10/1990 | Salamy | 430/191 |
| 5,073,622 | 12/1991 | Wojtech et al. | |

FOREIGN PATENT DOCUMENTS

0251187 1/1988 European Pat. Off.
57-74370 5/1982 Japan ............... C08G 77/34
1-228560 9/1989 Japan ............... B01J 47/04

OTHER PUBLICATIONS

Product Brochures—"Waste Water Treatment: Heavy Metal Removal and Recovery with Diaion CR-20" and Resin Choice in Removing Heavy Metals Diaion CR-10 vs. Diaion CR-20 (Dianex Systems—dated Dec., 1986 and Mar., 1987).

*Primary Examiner*—Morton Foelak
*Assistant Examiner*—Richard Jones
*Attorney, Agent, or Firm*—William A. Simons

[57] ABSTRACT

A chemically modified chelate resin comprising the reaction product of a cross-linked polymer bead chelate resin containing amine reaction sites with an aromatic aldehyde selected from the group consisting of 4-Formyl-benzo-15-Crown-5; 4-Formyl-benzo-18-Crown-6; 3,4-dihydroxybenzaldehyde; 3-ethoxy salicylaldehyde; salicylaldehyde; 2-pyridine carboxaldehyde, 3-pyridine carboxaldehyde; 4-pyridine carboxaldehyde; and pyrrole-2-carboxaldehyde.

11 Claims, No Drawings

SELECTED CHELATE RESINS AND THEIR USE TO REMOVE MULTIVALENT METAL IMPURITIES FROM RESIST COMPONENTS

BACKGROUND OF THE INVENTION

1. Field of the Invention

The present invention is directed to selected chemically modified chelate resins and their use to remove multivalent ions from resist components. In particular, this invention relates to a method for removing multivalent metals (including iron, chromium, copper, cobalt, and calcium) from a resist component solution or resist composition solution by contacting that solution with these selected chemically modified chelate resins.

2. Brief Description of the Related Art

Impurity levels in photoresist compositions are becoming an increasingly important concern. Impurity contamination, especially by metals, of photoresists may cause deterioration of the semiconductor devices made with said photoresists, thus shortening these devices' lives.

Impurity levels in photoresist compositions have been and are currently controlled by (1) choosing materials for photoresist composition which meet strict impurity level specifications and (2) carefully controlling the photoresist formulation and processing parameters to avoid the introduction of impurities into the photoresist composition. As photoresist applications become more advanced, tighter impurity specifications must be made.

In the case of novolak resin materials used for making positive photoresists, such novolak resins have been subjected to distillation or crystallization purification operations in order to remove impurities, especially metals. However, such operations have deficiencies. One, they are time-consuming and costly. More importantly, they do not remove impurities down to the very low levels now needed for advanced applications (i.e., in very low parts per billion maximum levels; typically below 50 parts per billion by weight for each metal).

Ion exchange resins have been used for novolak impurities. One general technique is to pass an impure novolak resin solution through a particulate cation exchange resin (e.g., AMBERLYST styrene sulfonate-divinyl benzene cation exchange resin). However, such treatments have several problems associated with it including the following:

1. The cation exchange resin treatment of the novolak may decrease the pH of the novolak-containing solution, possibly causing serious corrosion of metal containers in which the purified novolak-containing solution may be stored.

2. The purified novolak may have a decreased rate of dissolution during the development step of the photoresist which may be caused by the undesired adsorption of the lower molecular weight portion of novolak resin onto the cation exchange resin.

3. Alkali metals such as sodium and potassium are easily removed with conventional particulate cation exchange resins. However, divalent or trivalent metal cations (e.g., $Cu^{+2}$, $Ni^{+2}$, $Zn^{+2}$, $Fe^{+2}$, $Fe^{+3}$, $Ca^{+2}$, or $Cr^{+3}$ ions) may have a lower affinity to conventional cation exchange resins. Iron and other easily oxidizable metals cannot be completely removed because they may be colloidal metal hydroxides or oxides. Such colloidals are not significantly removed by cation exchange resin treatment.

4. Ion exchange resins, particularly strong acid-type of cation exchange resins, decompose resist components which contain or use solvents containing hydrolyzable groups such as esters. For example, ethyl lactate is decomposed by AMBERLYST A-15 to form polylactide moieties, which may degrade lithography performance of photoresists. As used herein, that term "polylactide" is defined as a polymeric or oligomeric product of a lactide, a cyclic dimer of lactic acid which is formed by hydrolysis of ethyl lactate.

In addition to the standard cation exchange resin treatment of the novolak resin, it is known to subject complete photoresist compositions (e.g., novolak resin, photosensitizer, and solvent) to both cation and anion exchange resin treatment. For example, Japanese Patent Publication (Kokai) No. 57-74370 discloses a method of reducing impurities in silica paint film liquid coating by suing cation exchange resins and anion exchange resins in separate and a successive manner. Japanese Patent Publication (Kokai) No. 01-228,560, which was published on Sep. 12, 1989, teaches that the metal impurities content in photosensitive resin solutions or photoresist compositions may be reduced with a mixture of a cation and anion exchange resins. However, these techniques have the deficiency of not removing divalent and trivalent metal impurities and may decompose resist components or solvents containing resist components. Usually, such cation and anion exchange resins have been washed with a solvent such as deionized water or the same solvent in which the resist component is already dissolved in. However, such washings with water or solvents will not clean the resins of preattached metal impurities because metal ions such as sodium or potassium as well as other acidic contaminants strongly bind to the anionically charged groups of cation exchange resins.

There are several ways now known to remove multivalent ion metal impurities such as iron, chromium, copper, calcium, and the like from resist components. These include (a) microfiltration, (b) clay treatment, and (c) conventional chelate resin treatment. All three methods are successful in removing large amounts of such multivalent impurities with many types of resist components; however, each of these methods may be either very slow or not always effective when attempting to obtain certain resist components having multivalent metal impurity levels below 50 ppb.

U.S. patent application Ser. No. 07/753,488, which was filed on Sep. 3, 1991 with Kenji Honda, Edward A. Fitzgerald, and Lawrence Ferriera as the co-inventors, is directed to a method for removing metal impurities from a resist component solution or a resist composition solution by contacting that solution with a cation exchange resin and a chelate resin. One of the chelate resins disclosed in this application is DIANION CR-20 polyamine-type chelate resin produced by Mitsubishi Kasei of Tokyo, Japan. This type of chelate resin advantageously will not decrease the pH of a photoresist solution or novolak solution during a metal ion removal step. However, this chelate resin, as well as other known chelate resins, will not consistently remove substantially all of the polyvalent metal ions from the solution (e.g., less than 100 ppb remaining for each polyvalent metal). Stronger chelating resins are needed for this purpose without lowering the pH of the solution.

Accordingly, there is still a need in the photoresist art for improved methods of removing metal impurities from novolak resins and other materials used as photoresist components without otherwise adversely affecting other properties of the resist component. The present invention is a solution to that need.

Separately, U.S. Pat. No. 4,446,284, which issued to parker on May 1, 1984, is directed to a process for producing polymers that contain pendant unsaturation. In particular, that process involves reacting a polymer containing a pendant phosphonium salt with an aldehyde in the presence of an alkali ionizable functionality to yield a polymer having a pendent unsaturation. See formula III in column 3. Among the polymer precursors listed as being suitable for this reaction is styrene/divinyl benzene. Among the suitable aldehyde reactants is 3,4-dihydroxybenzaldehyde. It is also noted that the resulting compounds may be used as chelates (see U.S. Pat. No. 4,446,284). However, this reference does not teach or suggest using polymer precursors with amine functionalities. Also, the reference does not teach or suggest that its reaction products may be used to remove multivalent metal impurities from any material, let alone resist components, as presently claimed.

SUMMARY OF THE INVENTION

Accordingly, one aspect of the present invention is directed to a chemically modified chelate resin comprising the reaction product of a cross-linked polymer bead chelate resin containing amine reaction sites with an aromatic aldehyde selected from the group consisting of 4-Formyl-benzo-15-Crown-5; 4-Formyl-benzo-18-Crown-6; 3,4-dihydroxybenzaldehyde; 3-ethoxy salicylaldehyde; salicylaldehyde; 2-pyridine carboxaldehyde, 3-pyridine carboxaldehyde; 4-pyridine carboxaldehyde; and pyrrole-2-carboxaldehyde.

Another aspect of the present invention is directed to a method for removing multivalent metal impurities from a resist component, comprising the steps of:

(1) dissolving a resist component containing multivalent metal impurities in a solvent;

(2) contacting said resist component solution with a chemically modified chelate resin for a sufficient amount of time to attach at least a portion of said metal impurities onto said chelate resin, wherein said chemically modified resin is the reaction product of a cross-linked polymer bead chelate resin containing amine reaction sites with an aromatic aldehyde selected from the group consisting of 4-Formyl-benzo-15-Crown-5; 4-Formyl-benzo-18-Crown-6; 3,4-dihydroxybenzaldehyde; 3-ethoxy salicylaldehyde; salicylaldehyde; 2-pyridine carboxaldehyde; 3-pyridine carboxaldehyde; 4-pyridine carboxaldehyde; and pyrrole-2-carboxaldehyde; and (3) separating said chemically modified chelate resin bearing said multivalent metal impurities from said resist component solution.

DESCRIPTION OF THE PREFERRED EMBODIMENTS

The cross-linked polymer bead chelate resin precursor containing amine reaction sites may by any polyamine type chelate resin which is suitable to react with aromatic aldehydes. Chelate resins which have a highly porous structure, are based on polystyrene cross-linked with divinyl benzene and have polyamine-type functional chelating groups are preferred.

The most preferred chelate resin is DIAION CR-20 made by Mitsubishi Kasei of Tokyo, Japan. This chelate resin is a cross-linked styrene-divinyl benzene copolymer resin having polyamine function chelating groups and has an average 1.2 micron particle diameter. Its polymer structure is highly porous (third generation microporous) and its effective pH range is from about 4 to 6. It has the following general resin structure:

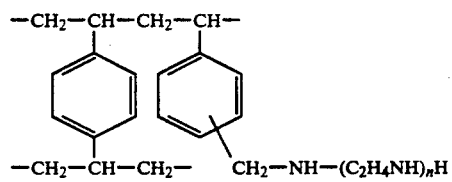

The aromatic aldehyde precursors of the present invention have the following structural formulae:

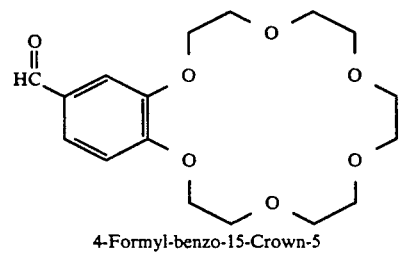

4-Formyl-benzo-15-Crown-5

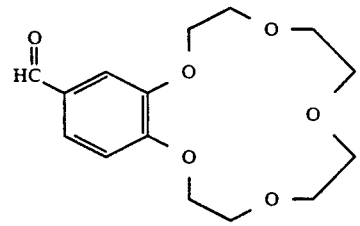

4-Formyl-benzo-18-Crown-6

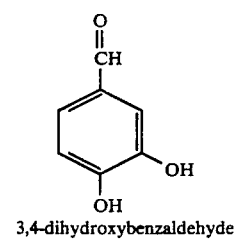

3,4-dihydroxybenzaldehyde

3-ethoxy salicylaldehyde

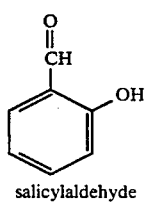

salicylaldehyde

-continued

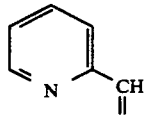
2-pyridinecarboxaldehyde

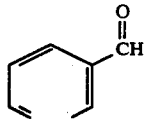
3-pyridinecarboxaldehyde

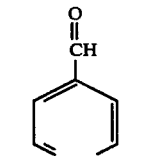
4-pyridinecarboxaldehyde

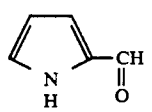
Pyrrole-2-carboxaldehyde

The amine-type chelate resin and aromatic aldehyde precursors are preferably reacted together in the presence of a weak acid, preferably glacial acetic acid at room temperature. The reaction proceeds quite slowly at that temperature and generally 2 to 5 days are needed for completion.

After completion of the reaction, the resultant chemically modified resin particles are preferably washed with methanol or other suitable solvent. The washing procedure is preferably repeated more than once to remove any acid or unreacted aldehyde remaining on particles.

The preferred mole ratio of the precursor to the amine group of the resin is 1 to 100, preferably 2-10.

The term "resist component" as used in the present specification and claims includes alkali-soluble resins such as novolak resins and polyvinyl phenol resins, photoactive compounds as well as their precursors, and additives (e.g., speed enhancers, dyes, and the like) conventionally employed in photoresist compositions. This term also includes precursor compounds for making such components. Examples of such precursor compounds would be backbone compounds for making photoactive compounds as well as the precursor photoactive ester compounds (e.g., naphthaquinone diazide sulfonyl chlorides).

The term "novolak resin" as used herein refers to any novolak resin which will dissolve completely in an alkaline developing solution conventionally used with positive-working photoresist composition. Suitable novolak resins include phenol-formaldehyde novolak resins, cresol-formaldehyde novolak resins, xylenol-formaldehyde novolak resins, cresol-xylenol-formaldehyde novolak resins, preferably having a molecular weight of about 500 to about 40,000, and more preferably from about 800 to 20,000. These novolak resins are preferably prepared by the addition-condensation polymerization of a phenolic monomer or monomers (e.g., phenol, cresols, xylenols, or mixtures of such monomers) with an aldehyde source such as formaldehyde and are characterized by being light-stable, water-insoluble, alkali-soluble, and film-forming. One preferred class of novolak resins is formed by the condensation polymerization between a mixture of m- and p-cresols with formaldehyde having a molecular weight of about 1,000 to about 10,000. Illustrative preparations of novolak resins are disclosed in U.S. Pat. Nos. 4,377,631; 4,529,682; and 4,587,196, all of which issued to Medhat Toukhy and are incorporated herein by reference in their entireties.

Other preferred novolak resins are illustrated in U.S. patent application Ser. Nos. 07/405,802 and 07/713,891 which were filed by Charles Ebersole on Sep. 8, 1989 and Jun. 12, 1991, respectively Their disclosures are also incorporated herein by reference in their entireties.

The term "photoactive compounds" as employed in the present specification and claims may include any conventional photoactive compound commonly used in photoresist compositions. Quinonediazide compounds are one preferred class of compounds with naphthoquinone diazide compounds a preferred class of species in that generic class. As mentioned above, photoactive compound precursors may be treated according to the present invention. One photoactive compound precursor which has been treated according to this method is 2,6-bis(2,3,4-trihydroxyphenyl)methylene-4-methyl phenol (also known as 7-PyOL) which is described in Example 3 of U.S. Pat. No. 4,992,356.

Photoresist additives may be treated according to the present invention. Such additives may include speed enhancers, dyes, and the like. One preferred speed enhancer is 1-[(1'-methyl-1'-(4'-hydroxyphenyl)-ethyl)]4-[1', 1'-bis-(4-hydroxyphenyl)ethyl]benzene (also known as TRISP-PA).

In the first step of the present process, the resist component is dissolved in a solvent or solvent mixture to facilitate the contacting of the resist component with the cationic exchange resin and the chelate resin. Examples of suitable solvents include acetone, methoxyacetoxy propane, ethyl cellosolve acetate, n-butyl acetate, ethyl lactate, ethyl-3-ethoxy propionate, propylene glycol, alkyl ether acetate, or mixtures thereof and the like. Cosolvents such as xylene or n-butyl acetate may also be used. One preferred solvent is a mixture of ethyl lactate and ethyl-3-ethoxy propionate wherein the weight ratio of ethyl lactate to ethyl-3-ethoxy propionate is from about 0:70 to about 95:5.

The solids contents of the resultant resist component solution is not critical. Preferably, the amount of solvent or solvents may be from about 50% to about 500%, or higher, by weight; more preferably from about 75% to about 400% by weight; based on the resist component weight.

While it is preferred to use a single resist component as the material being treated by the method of the present process, it is contemplated within the scope of the present invention that combinations of resist components may be treated. For example, it may be desirable to treat a complete positive-working photoresist formulation (e.g., a combination of a novolak resin or resins, a photoactive compound such as quinonediazide sensitizer, and solvent or solvents as well as conventional optional minor ingredients such as dyes, speed enhancers, surfactants, and the like) according to the method of the present invention.

The multivalent metal impurities in the resist component solution may be in the form of divalent or trivalent cations (e.g., $Ca^{+2}$, $Fe^{+2}$, $Fe^{+3}$, $Cr^{+3}$, or $Zn^{+2}$). Such metal impurities may also be in the form of collidal particles such as insoluble colloidal iron hydroxides and oxides. Such metal impurities may come from the chemical precursors for the resist component (e.g., for novolak resins these may be phenolic monomers and aldehyde sources) as well as in the solvent used to make the solution. These impurities may also come from the catalysts used to make the resist components or from the equipment used for their synthesis or storage. Generally, the amount of metal impurities in a resist component such as a novolak resin prior to the present inventive process is the range from 500 ppb–5,000 ppb, or greater, by weight for metals such as sodium and iron. The iron impurities are in the form of divalent and trivalent species ($Fe^{+2}$ and $Fe^{+3}$) as well as insoluble colloidal iron species (e.g., iron hydroxides and oxides).

The resist component solutions may be made in any conventional method of mixing a resist component with a solvent. Generally, it is preferred that the resist component is added to a sufficient amount of solvent so that the resist component is dissolved in the solvent. This step may be facilitated by agitation or other conventional mixing means.

The next step in the process of the present invention is contacting the resist component solution with at least one chemically modified chelate resin of the present invention.

The relative amounts of chemically modified chelate resin and cation exchange resin employed in this process are preferably from about 1% to about 10% by weight, based on the resist component solution. More preferably, these relative amounts are from about 2% to about 6% by weight, based on said total solution.

The amount of time for the contacting should be sufficient to attach at least a portion (preferably, at least a major portion—at least 50%—by weight and more preferably, at least 90%) by weight of each multivalent metal present in the resist component solution. Most preferably, the contacting should be sufficient so that the level of all multivalent metal is below 50 ppb by weight of the solution.

The contacting may occur in a ion exchange column where the chemically modified chelate resin is packed therein and the resist component solution is passed through the column. Preferably, the resist component solution is passed at a constant rate and constant temperature to maximize absorption of the multivalent metal impurities onto the chelate resins. Alternatively, the chemically modified chelate resin may be mixed together into the resist component solution to provide a resultant suspension. After a sufficient contacting time has passed, the chemically modified chelate resin is removed, preferably by filtration, from the resist component solution. Preferably, it may be advantageous in some situations to predisperse the chemically modified chelate resin in the same solvent as used for the resist component solution before adding the resist component solution. Further, it may be preferable to maximize absorption onto the chemically modified chelate resin by carrying out the contacting in this mode at constant temperature.

The separation step (3) of the present invention necessarily occurs immediately after the contacting step (2) when a packed column system is used. With the batch system, the separation step (3) requires an additional step by the operator.

It may be preferred to have other optional material contact the resist component solution besides the chemically modified chelate resin. Preferred optional materials include cation exchange resins and anion exchange resins such as those described in U.S. patent application Ser. No. 07/753,488 mentioned above. This U.S. patent application is hereby incorporated by reference in its entirety.

If the untreated resist component solution contains a significant amount of insoluble colloidal hydroxides or oxides, the resist component solution may be passed through a micro-pore membrane having a pore size of 0.05–0.5 microns prior to the contacting with the cation exchange resin and chelate resin. This filtration operation will remove at least a portion of the insoluble colloids and these make the contacting steps (b) more efficient.

The following Examples and Comparisons are given to further illustrate the present invention. All parts and percentages are by weight unless explicitly stated otherwise.

EXAMPLE 1

A polyamine-type chelate resin[1] (10 grams), 3,4-dihydroxybenzaldehyde (5.0 grams), and glacial acetic acid (250 grams) were placed in a plastic bottle and the mixture was rolled with a bottle roller at room temperature (20°–30° C.) for three days. After that period, the liquid supernatant was decanted from the chemically modified resin particles.

(1) CR-20 polyamine-type chelate resin available from Mitsubishi Kasei Co. Ltd. of Tokyo, Japan.

The chemically modified resin particles were then washed with methanol (250 grams). The washing operation was carried out by combining the resin particles and the methanol in a bottle and then rolling that mixture in a bottle roller at room temperature for 30 minutes. After the rolling was completed, the methanol was decanted off of the resin particles.

This methanol washing operation was repeated twice more using fresh methanol for each wash. After the three washings, the resin particles were dried under a vacuum at room temperature.

Next, the dried chemically modified resin (1.0 gram) was added to a phenolic novolak dissolved in ethyl lactate (20 grams total; 33% by weight novolak) in a plastic bottle. The bottle was rolled on a bottle roller for three days at room temperature. The resultant suspension was filtered through a Teflon membrane filter (0.2 micron pore size) to separate the chemically modified chelate resin from the novolak resin/ethyl lactate solution.

The levels of iron and chromium in the novolak resin/ethyl lactate solution were measured by ICP (an inductively coupled plasma atomic absorption spectrometry) both before mixing with the chemically modified chelate resin and after the treatment followed by the microfiltration step. The results of such measurements are given in Table 1:

TABLE 1

| Metal | Before | After |
|---|---|---|
| Fe | 785 ppb | 63 ppb |
| Cr | 301 ppb | 121 ppb |

This data indicates that contacting a resist component such as a novolak resin/ethyl lactate solution with a chemically-modified chelate resin of the present invention will result in a satisfactory decrease in metal impurity levels such as Fe and Cr in said resist component.

EXAMPLE 2-7

Six (6) different mixtures of the same dried modified resin particles in Example 1 with a second type of phenolic novolak dissolved in a mixture of ethyl lactate and ethyl 3-ethoxy propionate (95% EL:5% EEP) were made. For each mixture, a predetermined amount of the dried modified novolak particles was added to the phenolic novolak solution (20 grams total; 34% by weight novolak) in a plastic bottle. The amounts of modified six mixtures were either 1, 2, or 5% by weight of the total novolak solution. The six bottles were rolled for either one, four or five days at room temperature. The resultant suspensions were then filtered through a Teflon membrane filter (0.2 micron pore size) to separate the chemically modified chelate resin from the novolak resin/ethyl lactate solution.

The levels of iron, chromium, zinc, copper, and calcium in the novolak solution were measured by ICP both before mixing with the chemically modified chelate resin and after the microfiltration step. The results of these measurements are given in Table 2:

TABLE 2

| Example | Chelate Resin (wt %) | Treatment Time (day) | Metal Contents (ppb) | | | | |
|---|---|---|---|---|---|---|---|
| | | | Fe | Cr | Zn | Cu | Ca |
| Ref. | None | 0 | 550 | 44 | 43 | 71 | 11 |
| 2 | 1.0 | 1 | 323 | 46 | 30 | 47 | 33 |
| 3 | 1.0 | 4 | 87 | 43 | 28 | 16 | 27 |
| 4 | 2.0 | 1 | 197 | 42 | 155 | 36 | 24 |
| 5 | 2.0 | 4 | 49 | 38 | 32 | 13 | 20 |
| 6 | 5.0 | 1 | 81 | 32 | 30 | 55 | 13 |
| 7 | 5.0 | 5 | 30 | 28 | 19 | 30 | 17 |

This data indicates that if the dose of the chemically modified chelate resin was either 1% or 2% of the novolak solution, the iron level was not decreased below 100 ppb after only one day of treatment, but required four days of treatment. If the dosage was increased to 5% by weight of the novolak resin, the iron level was decreased below 100 ppb after one day of the treatment and further went down to 30 ppb after five days. It is believed that the 5% by weight dosage of this particular chemically modified chelate resin would be acceptable to treat photoresist components such as novolak resins because this type of-resin does not decrease the pH of the novolak solution. The differences in metal level decreases between those in Example 1 and those in Examples 2-7 may be explained by the different novolak resins used and different solvents used.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A method for removing multivalent metal impurities from a resist component, comprising the steps of:
   (1) dissolving a resist component containing multivalent metal impurities in a solvent;
   (2) contacting said resist component solution with a chemically modified chelate resin for a sufficient amount of time to attach at least a portion of said metal impurities onto said chelate resin, wherein said chemically modified resin is the reaction product of a cross-linked polymer bead chelate resin containing amine reaction sites with an aromatic aldehyde selected from the group consisting of 4-Formyl-benzo-15-Crown-5; 4-Formyl-benzo-18-Crown-6; 3,4-dihydroxybenzaldehyde; 3-ethoxy salicylaldehyde; salicylaldehyde; 2-pyridine carboxaldehyde; 3-pyridine carboxaldehyde; 4-pyridine carboxaldehyde; and pyrrole-2-carboxaldehyde; and
   (3) separating said chemically modified chelate resin bearing said multivalent metal impurities from said resist component solution.

2. The method of claim 1 wherein, said aromatic aldehyde is 3,4-dihydroxybenzaldehyde.

3. The method of claim 1 wherein said cross-linked polymer bead chelate resin has a highly porous structure, is based on polystyrene cross-linked with divinyl benzene, and has polyamine-type functional chelating groups.

4. The method of claim 1 wherein said contacting (2) comprises adding said chemically modified chelate resin to said resist component solution and said separating (3) comprises decanting or filtering said resist component solution from said chemically modified chelate resin.

5. The method of claim 1 wherein said contacting and separating steps comprise passing said resist component solution through at least one packed column or bed containing said chemically modified chelate resin.

6. The method of claim 1 wherein said solvent comprises ethyl lactate, ethyl 3-ethoxy propionate, or mixtures thereof.

7. The method of claim 1 wherein said contacting step is sufficient to cause said resist component solution to contain less than 50 ppb of each multivalent metal impurity after said separation step.

8. The method of claim 1 wherein said resist component is a novolak resin.

9. A chemically modified chelate resin comprising the reaction product in the presence of an acid of a cross-linked polymer bead chelate resin containing amine reaction sites with an aromatic aldehyde selected from the group consisting of 4-Formyl-benzo-15-Crown-5; 4-Formyl-benzo-18-Crown-6; 3,4-dihydroxybenzaldehyde; 3-ethoxy salicylaldehyde; salicylaldehyde; 2-pyridine carboxaldehyde, 3-pyridine carboxaldehyde; 4-pyridine carboxaldehyde; and pyrrole-2-carboxaldehyde.

10. The chelate resin of claim 9 wherein said cross-linked polymer bead chelate resin has a highly porous structure, is based on polystyrene cross-linked with divinyl benzene, and has polyamine-type functional chelating groups.

11. The product of claim 9 wherein said aromatic aldehyde is 3,4-dihydroxybenzaldehyde.

* * * * *